US011757064B2

(12) United States Patent
Torimoto et al.

(10) Patent No.: US 11,757,064 B2
(45) Date of Patent: Sep. 12, 2023

(54) SEMICONDUCTOR NANOPARTICLE, METHOD FOR MANUFACTURING SAME, AND LIGHT EMITTING DEVICE

(71) Applicants: National University Corporation Tokai National Higher Education and Research System, Nagoya (JP); OSAKA UNIVERSITY, Suita (JP); NICHIA CORPORATION, Anan (JP)

(72) Inventors: Tsukasa Torimoto, Nagoya (JP); Tatsuya Kameyama, Nagoya (JP); Yuki Mori, Nagoya (JP); Hiroki Yamauchi, Nagoya (JP); Susumu Kuwabata, Ibaraki (JP); Taro Uematsu, Suita (JP); Daisuke Oyamatsu, Tokushima (JP)

(73) Assignees: National University Corporation Tokai National Higher Education and Research System, Nagoya (JP); OSAKA UNIVERSITY, Suita (JP); NICHIA CORPORATION, Anan (JP)

( * ) Notice: Subject to any disclaimer, the term of this patent is extended or adjusted under 35 U.S.C. 154(b) by 201 days.

(21) Appl. No.: 16/815,359

(22) Filed: Mar. 11, 2020

(65) Prior Publication Data
US 2020/0295227 A1    Sep. 17, 2020

(30) Foreign Application Priority Data
Mar. 12, 2019  (JP) ................................. 2019-044832

(51) Int. Cl.
*H01L 33/06*  (2010.01)
*H01L 33/00*  (2010.01)
(Continued)

(52) U.S. Cl.
CPC .............. *H01L 33/06* (2013.01); *B82Y 15/00* (2013.01); *B82Y 40/00* (2013.01); *H01L 33/0095* (2013.01); *H01L 2933/0033* (2013.01)

(58) Field of Classification Search
None
See application file for complete search history.

(56) References Cited

U.S. PATENT DOCUMENTS

| 4,086,123 A * | 4/1978 | Hummel ............... C09C 1/0009 |
| | | 106/420 |
| 2010/0193806 A1 | 8/2010 | Byun |
| 2017/0022413 A1 | 1/2017 | Torimoto et al. |

FOREIGN PATENT DOCUMENTS

| JP | 2010177656 A | 8/2010 |
| JP | 2012212862 A | 11/2012 |

(Continued)

OTHER PUBLICATIONS

Atuchin et al. "Core level photoelectron spectroscopy of LiGaS2 and Ga-S bonding in complex sulfides" Journal of Alloys and Compounds (2010) pp. 244-248 (Year: 2010).*

*Primary Examiner* — Bradley Smith
(74) *Attorney, Agent, or Firm* — Hunton Andrews Kurth LLP

(57) ABSTRACT

Provided is a method for manufacturing a semiconductor nanoparticle, the method includes performing a heat treatment of a first mixture containing a silver (Ag) salt, an alkali metal salt, a salt containing at least one of indium (In) and gallium (Ga), a sulfur source, and an organic solvent. A ratio of the number of atoms of an alkali metal to the total number of atoms of Ag and the alkali metal in the first mixture is greater than 0 and less than 1.

4 Claims, 4 Drawing Sheets

(51) Int. Cl.
    *B82Y 40/00*     (2011.01)
    *B82Y 15/00*     (2011.01)

(56) References Cited

FOREIGN PATENT DOCUMENTS

| JP | 2017014476 A | | 1/2017 |
|---|---|---|---|
| JP | 2017025201 A | | 2/2017 |
| WO | WO-2020217649 A1 | * | 10/2020 |

* cited by examiner

US 11,757,064 B2

SEMICONDUCTOR NANOPARTICLE, METHOD FOR MANUFACTURING SAME, AND LIGHT EMITTING DEVICE

CROSS-REFERENCE TO RELATED APPLICATIONS

This application claims priority to Japanese Patent Application No. 2019-044832, filed on Mar. 12, 2019, and Japanese Patent Application No. 2020-039194, filed on Mar. 6, 2020, the disclosure of which are hereby incorporated by reference in their entirety.

BACKGROUND

Field of the Invention

The present disclosure relates to a semiconductor nanoparticle, a method for manufacturing the same, and a light emitting device.

Description of the Related Art

Semiconductor particles are known to produce a quantum size effect when the particle diameter thereof is 10 nm or less, for example, and such nanoparticles are called quantum dots (also referred to as semiconductor quantum dots). The quantum size effect refers to a phenomenon in which each of valence and conduction bands considered to be continuous in bulk particles becomes discrete in nanoparticles so that band gap energy changes depending on a particle diameter.

Since quantum dots can absorb light and convert the wavelength into that of light corresponding to the band gap energy, a white light emitting device using light emission of quantum dots has been proposed (see, e.g., Japanese Laid-Open Patent Publication Nos. 2012-212862 and 2010-177656). Specifically, it is proposed to allow quantum dots to absorb a portion of light emitted from a light emitting diode (LED) chip so as to obtain white light having a mixed color of the light emitted from the quantum dots and the light emitted from the LED chip. In Japanese Laid-Open Patent Publication Nos. 2012-212862 and 2010-177656, it is proposed to use binary quantum dots of group 12 to group 16 such as CdSe and CdTe, and group 14 to group 16 such as PbS and PbSe. Additionally, tellurium compound nanoparticles (see, e.g., Japanese Laid-Open Patent Publication No. 2017-014476) and sulfide nanoparticles (see, e.g., Japanese Laid-Open Patent Publication No. 2017-025201) are proposed as ternary semiconductor nanoparticles that is capable of band edge emission and that may have a low toxicity composition.

SUMMARY

A first aspect provides a method for manufacturing a semiconductor nanoparticle including: performing a heat treatment of a first mixture containing a silver (Ag) salt, an alkali metal salt, a salt containing at least one of indium (In) and gallium (Ga), a sulfur source, and an organic solvent. In the method for manufacturing a semiconductor nanoparticle, a ratio of the number of atoms of an alkali metal to the total number of atoms of Ag and the alkali metal in the first mixture is greater than 0 and less than 1.

A second aspect provides a method for manufacturing a core-shell type semiconductor nanoparticle including: obtaining a semiconductor nanoparticle by performing a heat treatment of a first mixture containing a silver (Ag) salt, an alkali metal salt, a salt containing at least one of indium (In) and gallium (Ga), a sulfur source, and an organic solvent; and performing a heat treatment of a second mixture containing the semiconductor nanoparticle, a compound containing a group 13 element, and a simple substance of a group 16 element or a compound containing a group 16 element, and an organic solvent. In the method for manufacturing a core-shell type semiconductor nanoparticle, a ratio of the number of atoms of an alkali metal to the total number of atoms of Ag and the alkali metal in the first mixture is greater than 0 and less than 1.

A third aspect provides a semiconductor nanoparticle containing: Ag; an alkali metal; at least one of In and Ga; and S. A total content of Ag and the alkali metal is 10 mol % to 30 mol %, a total content of In and Ga is 15 mol % to 35 mol %, and a content of S is 35 mol % to 55 mol % in a composition of the semiconductor nanoparticle. A ratio of the number of atoms of the alkali metal to the total number of atoms of Ag and the alkali metal is greater than 0 and less than 1. The semiconductor nanoparticle irradiated with light having a wavelength in a range of 200 nm or more and less than 500 nm emits light having an emission peak wavelength in a range of 500 nm to 650 nm and a half-value width of 250 meV or less in an emission spectrum.

A fourth aspect provides a core-shell type semiconductor nanoparticle comprising: a core comprising the semiconductor nanoparticle; and a shell disposed on a surface of the core and comprising a semiconductor material substantially composed of a group 13 element and a group 16 element, wherein the core-shell type semiconductor nanoparticle emits light due to irradiation with light.

A fifth aspect provides a light emitting device including: a light conversion member containing the semiconductor nanoparticle or the core-shell type semiconductor nanoparticle; and a semiconductor light emitting element.

DETAILED DESCRIPTION

Figure 1:
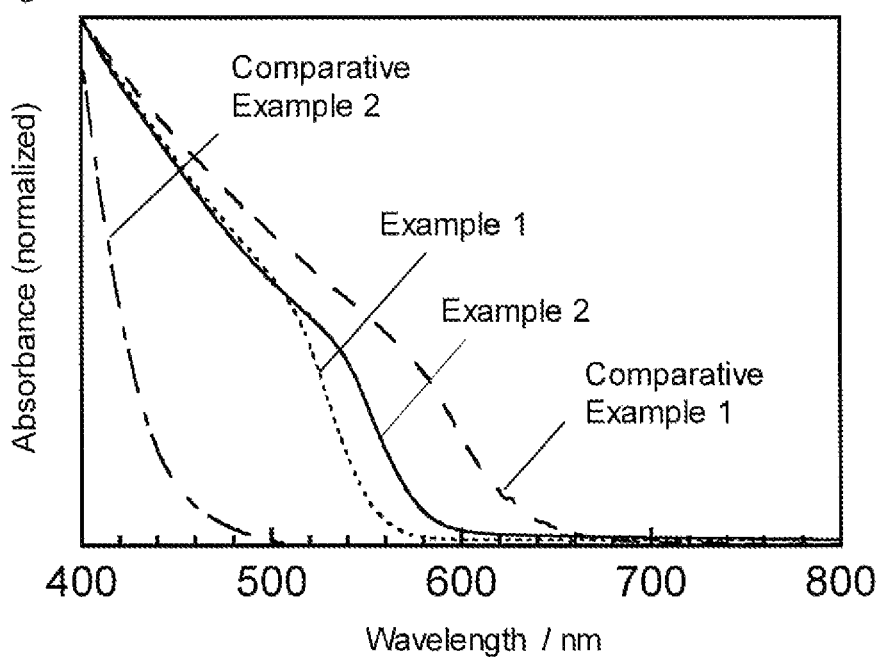
FIG. 1 shows examples of absorption spectra of the semiconductor nanoparticles of Example 1, Example 2, Comparative Example 1 and Comparative Example 2.

The term "step" as used herein includes not only an independent step but also a step not clearly distinguishable from another step as long as the intended purpose of the step is achieved. When multiple substances correspond to a component in a composition, the content of the component in the composition means the total amount of the multiple substances present in the composition unless otherwise specified. Embodiments of the present invention will now be described in detail with reference to the drawings. It is noted that the embodiments described below are exemplification of a semiconductor nanoparticle and a method for manufacturing the same for embodying the technical ideas of the present invention, and the present invention is not limited to the semiconductor nanoparticle and the method for manufacturing the same described below.

Semiconductor Nanoparticle

The semiconductor nanoparticle contains silver (Ag), an alkali metal, at least one of indium (In) and gallium (Ga), and sulfur (S). A total content of Ag and alkali metal is 10 mol % to 30 mol %, a total content of In and Ga is 15 mol % to 35 mol %, and a content of S is 35 mol % to 55 mol % in a composition of the semiconductor nanoparticle. A ratio of the number of atoms of the alkali metal to the total number of atoms of Ag and alkali metal is greater than 0 and less than 1. The semiconductor nanoparticle irradiated with light having a wavelength in a range of 200 nm or more and less than 500 nm emits light having an emission peak wavelength in a range of 500 nm to 650 nm and a half-value width of 250 meV or less in the emission spectrum.

The semiconductor nanoparticle containing Ag and the alkali metal (hereinafter also abbreviated as $M^a$), at least one of In and Ga, and S in the composition provides band edge emission due to the shape and size thereof. The semiconductor nanoparticle may have a composition not containing Cd and Pb considered to be highly toxic and may be also applicable to products etc. in which the use of Cd etc. is prohibited. Therefore, the semiconductor nanoparticle may suitably be used as a wavelength conversion substance for a light emitting device used in a liquid crystal display device, a biomolecule marker, etc.

Examples of the alkali metal ($M^a$) in the semiconductor nanoparticle include lithium (Li), sodium (Na), potassium (K), rubidium (Rb), cesium (Cs). The alkali metal, like Ag, may form a monovalent cation, and therefore may be substituted for a portion of Ag in the composition of the semiconductor nanoparticle. Particularly, Li has the ionic radius in the same level as Ag and may be preferably used. The substitution of a portion of Ag in the composition of the semiconductor nanoparticle widens a band gap, for example, and shifts an emission peak wavelength to a short wavelength. Additionally, although details are unknown, lattice defects of the semiconductor nanoparticle are reduced, so that a band edge emission quantum yield is provably improved.

The total content of Ag and $M^a$ in the composition of the semiconductor nanoparticle may be, for example, 10 mol % to 30 mol %, preferably 15 mol % to 25 mol %. The total content of In and Ga may be, for example, 15 mol % to 35 mol %, preferably 20 mol % to 30 mol %. The content of S may be, for example, 35 mol % to 55 mol %, preferably 40 mol % to 55 mol %.

The content of the alkali metal in the composition of the semiconductor nanoparticle may be, for example, greater than 0 mol % and less than 30 mol %, preferably 1 mol % to 25 mol %. A ratio ($M^a$/(Ag+$M^a$)) of the number of atoms of the alkali metal ($M^a$) to the total number of atoms of Ag and the alkali metal ($M^a$) in the composition of the semiconductor nanoparticle may be, for example, less than 1, Preferably 0.8 or less, more preferably, 0.4 or less, further preferably, 0.2 or less. The ratio may be, for example, greater than 0, preferably 0.05 or more, more preferably, 0.1 or more.

A ratio (In/(In+Ga)) of the number of atoms of In to the sum of the numbers of atoms of in and Ga in the composition of the semiconductor nanoparticle may be, for example, 0.01 to 1.0, preferably 0.1 to 0.99. A ratio ((Ag+$M^a$)/(In+Ga)) of the sum of the numbers of atoms of Ag and $M^a$ to the sum of the numbers of atoms of In and Ga may be, for example, 0.3 to 1.2, preferably 0.5 to 1.1. A ratio (S/(Ag+$M^a$+In+Ga)) of the number of atoms of S to the sum of the numbers of atoms of Ag, $M^a$, In, and Ga may be, for example, 0.8 to 1.5, preferably 0.9 to 1.2.

The semiconductor nanoparticle may have a composition represented by, for example, Formula (1):

$$(Ag_pM^a_{(1-p)})_qIn_rGa_{(1-r)}S_{(q+3)/2} \quad (1)$$

where p, q, and r satisfy $0<p<1.0$, $0.20<q\leq1.2$, and $0<r\leq1.0$. $M^a$ denotes the alkali metal.

The semiconductor nanoparticle may contain selenium (Se) in the composition. For example, selenium (Se) may be contained and substituted for a portion of sulfur (S) in the composition of the semiconductor nanoparticle. When the semiconductor nanoparticle contains selenium (Se) in the composition, the content thereof may be, for example, greater than 0 mol % and less than 50 mol %, preferably 1 mol % to 45 mol %, more preferably 15 mol %. % To 42 mol %. The total content of sulfur (S) and selenium (Se) in the composition of the semiconductor nanoparticle may be, for example, 35 mol % to 55 mol %, preferably 40 mol % to 55 mol %. Furthermore, a ratio (S/(S+Se)) of the number of atoms of sulfur (S) to the sum of the numbers of atoms of sulfur (S) and selenium (Se) in the composition of the semiconductor nanoparticle may be, for example, less than 1, preferably 0.95 or less, more preferably 0.9 or less, still more preferably 0.85 or less, further preferably 0.8 or less, still further preferably 0.7 or less. The ratio may be, for example, greater than 0, preferably 0.1 or more. When containing selenium, the semiconductor nanoparticle irradiated with light having a wavelength in the range of 200 nm or more and less than 500 nm may emit light having an emission peak wavelength in a range of 500 nm to 900 nm and a half-value width of 250 meV or less in the emission spectrum.

The semiconductor nanoparticle containing selenium (Se) in the composition may have a composition represented by, for example, Formula (2):

$$(Ag_pM^a_{(1-p)})_qIn_rGa_{(1-r)}(S_s+Se_{(1-s)})_{(q+3)/2} \quad (2)$$

where p, q, r, and s satisfy $0<p<1.0$, $0.20<q\leq1.2$, $0<r\leq1.0$, and $0<s<1.0$. $M^a$ denotes the alkali metal.

The composition of the semiconductor nanoparticle may be identified by energy dispersive X-ray analysis (EDX), X-ray fluorescence analysis (XRF), and inductively coupled plasma (ICP) emission spectrochemical analysis, for example. (Ag+$M^a$)/(In+Ga), S/(Ag+$M^a$+In+Ga), etc. may be calculated based on the composition identified by any of these methods.

The composition of the semiconductor nanoparticle may contain at least one element of Cu and Au substituted for a portion of Ag; however, preferably, the composition substantially consists of Ag. In this case, "substantially" means that the proportion of the elements other than Ag to Ag may be, for example, 10 mol % or less, preferably 5 mol % or less, more preferably 1 mol % or less.

In the composition of the semiconductor nanoparticle, $M^a$ preferably at least contains Li and preferably substantially consists of Li. In this case, "substantially" means that the proportion of the alkali metal other than Li to Li may be, for example, 10 mol % or less, preferably 5 mol % or less, more preferably 1 mol % or less.

The composition of the semiconductor nanoparticle may contain at least one element of Al and Tl substituted for a portion of at least one of In and Ga; however, preferably, the composition substantially contains at least one of In and Ga. In this case, "substantially" means that the proportion of the elements other than In or Ga to a total of In and Ga may be, for example, 10 mol % or less, preferably 5 mol % or less, more preferably 1 mol % or less.

The composition of the semiconductor nanoparticle may contain at least one element of Se and Te substituted for a portion of S or may substantially consist of S. In this case, "substantially" means that the proportion of elements other than S to S may be, for example, 10 mol % or less, preferably 5 mol % or less, more preferably 1 mol % or less.

The semiconductor nanoparticle may substantially be composed only of Ag, $M^a$, at least one of In and Ga, and S. The semiconductor nanoparticle may substantially be composed only of Ag, $M^a$, at least one of In and Ga, and Se and S. The term "substantially" is used in consideration of the fact that an element other than Ag, $M^a$, In, Ga, S, and Se may be inevitably contained due to impurities contamination.

The crystal structure of the semiconductor nanoparticle may include at least one selected from the group consisting of tetragonal, hexagonal, and orthorhombic. For example, semiconductor nanoparticles containing Ag, In, and S and having a tetragonal, hexagonal, or orthorhombic crystal structure are introduced in literatures as particles generally represented by a composition formula of $AgInS_2$. The semiconductor nanoparticle according to the present embodiment may be considered as having a portion of Ag substituted with the alkali metal and a portion of a group 13 element In substituted with a group 13 element Ga. The composition of the semiconductor nanoparticle may be represented by Ag-$M^a$-In—Ga—S, or Ag-$M^a$-In—Ga—S—Se, for example.

Among the semiconductor nanoparticles represented by the compositional formula Ag-$M^a$-In—Ga—S, those having a hexagonal crystal structure is a wurtzite type, and semiconductors having a tetragonal crystal structure is a chalcopyrite type. For example, the crystal structure may be identified by measuring an XRD pattern obtained by X-ray diffraction (XRD) analysis. Specifically, the XRD pattern obtained from the semiconductor nanoparticle may be compared with known XRD patterns assumed as semiconductor nanoparticles represented by the composition of $AgInS_2$ or with XRD patterns obtained by performing simulations from crystal structure parameters. When the known patterns and the simulated patterns include a pattern identical with the semiconductor nanoparticle pattern, the crystal structure of the semiconductor nanoparticle may be considered as the crystal structure of the identical known or simulated pattern.

In an aggregate of semiconductor nanoparticles, semiconductor nanoparticles having different crystal structures may partially be mixed. In this case, peaks derived from multiple crystal structures are observed in the XRD pattern.

The semiconductor nanoparticles have an average particle diameter of 50 nm or less, for example. The average particle diameter of the semiconductor nanoparticles may be, for example, 20 nm or less, 10 nm or less, or less than 10 nm. When the average particle diameter is 50 nm or less, the quantum size effect is easily obtained, and the band edge emission tends to be easily obtained. The lower limit of the average particle diameter is 1 nm, for example.

The particle diameter of the semiconductor nanoparticle can be obtained from a TEM image taken by using a transmission electron microscope (TEM), for example. Specifically, a particle diameter of a certain particle is defined as a length of a longest one of line segments connecting any two points on a particle outer circumference observed in the TEM image for the particle and passing through the inside of the particle.

However, when the particle has a rod shape, a length of a minor axis is considered as the particle diameter. Here, the rod-shaped particle is a particle having a minor axis and a major axis perpendicular to the minor axis in the TEM image and having a ratio of the length of the major axis to the length of the minor axis larger than 1.2. The rod-shaped particle is observed in the TEM image as, for example, a quadrilateral shape such as a rectangular shape, an elliptical shape, or a polygonal shape. A cross-sectional shape of a plane orthogonal to the major axis of the rod shape may be, for example, a circle, an ellipse, or a polygon. Specifically, regarding the rod-shaped particles, the length of the major axis refers to the length of the longest one of the line segments connecting any two points on the particle outer circumference in the case of the elliptical shape or the length of the longest one of the line segments parallel to a longest side defining the outer circumference and connecting any two points on the particle outer circumference in the case of the rectangular shape or the polygonal shape. The length of the minor axis refers to the length of the longest line segment orthogonal to the line segment defining the length of the major axis among the line segments connecting any two points on the outer circumference.

The average particle diameter of the semiconductor nanoparticle is an arithmetic average of particle diameters obtained by measuring particle diameters of all measurable particles observed in a 50,000× to 150,000×TEM image. The measurable particles are particles entirely observed in the TEM image. Therefore, a particle having a portion not falling within and cut out from the imaging range of the TEM image is not measurable. When the number of the measurable particles in one TEM image is 100 or more, the average particle diameter is obtained by using the TEM image. On the other hand, when the number of the measurable particles in one TEM image is less than 100, one or more TEM images are further obtained at different imaging locations, and the particle diameters of 100 or more measurable particles in two or more TEM images are measured to obtain the average particle diameter.

The semiconductor nanoparticle is capable of band edge emission. The semiconductor nanoparticle irradiated with light having a wavelength in the range of 200 nm or more and less than 500 nm emits light having an emission peak wavelength in a range of 500 nm to 650 nm. The half-value width in the emission spectrum of the semiconductor nanoparticle is 250 meV or less, preferably 200 meV or less, more preferably 150 meV or less. The lower limit value of the half-value width is, for example, 30 meV or more. The half-value width of 250 meV or less means the half-value width of 73 nm or less when the emission peak wavelength is 600 nm, the half-value width of 100 nm or less when the emission peak wavelength is 700 nm, and the half-value width of 130 nm or less when the emission peak wavelength is 800 nm and means that the semiconductor nanoparticle produces the band edge emission.

The semiconductor nanoparticle may provide other emission, for example, defect emission, along with the band edge emission. The defect emission generally has a long emission lifetime, has a broad spectrum, and has a peak at a longer wavelength than the band edge emission. When both the band edge emission and the defect emission are obtained, the intensity of the band edge emission is preferably greater than the intensity of defect emission.

The band edge emission of the semiconductor nanoparticle may be changed in peak position by changing at least one of the shape and the average particle diameter, or particularly, the average particle diameter, of the semiconductor nanoparticles. For example, when the average particle diameter of the semiconductor nanoparticles is made smaller, the band gap energy becomes larger due to the quantum size effect, and the peak wavelength of the band edge emission can be shifted toward a shorter wavelength.

The band edge emission of the semiconductor nanoparticles may be changed in emission peak wavelength by changing the composition of the semiconductor nanoparticles. For example, by increasing the Ga ratio (Ga/(In+Ga)), which is the ratio of the number of atoms of Ga to the sum of the numbers of atoms of In and Ga in the composition, the emission peak wavelength of the band edge emission can be shifted toward a shorter wavelength. For example, by selecting Li etc. as the alkali metal and increasing the $M^a$ ratio ($M^a$/(Ag+$M^a$)), which is the ratio of the number of atoms of the alkali metal ($M^a$) to the sum of the numbers of atoms of Ag and the alkali metal ($M^a$) in the composition, the emission peak wavelength of the band edge emission can be shifted toward a shorter wavelength. For example, by substituting Se for a portion of S in the composition and increasing the S ratio (S/(S+Se)), which is the ratio of the number of atoms of S to the sum of the numbers of atoms of S and Se, the emission peak wavelength of the band edge emission can be shifted toward a shorter wavelength.

The semiconductor nanoparticle preferably has an absorption spectrum exhibiting an exciton peak. The exciton peak is a peak obtained from exciton generation, and the occurrence thereof in the absorption spectrum means that semiconductor nanoparticles are made up of particles suitable for the band edge emission with a small particle diameter distribution and less crystal defects. Additionally, a steeper exciton peak means that a larger number of particles having a uniform particle diameter and fewer crystal defects are contained in an aggregate of the semiconductor nanoparticle. Therefore, when the exciton peak is steep, the half-value width of emission becomes narrow, and the light emission efficiency is expected to be improved. In the absorption spectrum of the semiconductor nanoparticle, the exciton peak is observed within a range of 350 nm to 900 nm, for example.

The semiconductor nanoparticle emits light having an emission peak at a longer wavelength than the exciton peak of the absorption spectrum due to a Stokes shift. When the absorption spectrum of the semiconductor nanoparticle exhibits an exciton peak, an energy difference between the exciton peak and the emission peak wavelength may be 300 meV or less, for example.

Core-Shell Type Semiconductor Nanoparticle

The semiconductor nanoparticle preferably may have a core-shell structure in which a shell is disposed on a surface of the semiconductor nanoparticle. The core-shell type semiconductor nanoparticle is formed by disposing a semiconductor constituting a shell on the surface of the semiconductor nanoparticle. The shell may be a semiconductor having a band gap energy larger than a semiconductor constituting a core and is made up of a semiconductor containing a group 13 element and a group 16 element. Examples of the group 13 element include B, Al, Ga, In, and Tl, and examples of the group 16 element include O, S, Se, Te, and Po. The semiconductor constituting the shell may contain only one or two or more of the group 13 elements and may contain only one or two or more of the group 16 elements.

The shell may be made up of a semiconductor substantially composed of the group 13 and group 16 elements. In this case, "substantially" means that when the total number of atoms of all elements contained in the shell is 100%, the proportion of elements other than the group 13 and group 16 elements may be, for example, 10% or less, Preferably 5% or less, more preferably 1% or less.

The shell may be configured by selecting a composition etc. depending on the band gap energy of the semiconductor constituting the core. Alternatively, when the composition etc. of the shell are determined in advance, the core may be designed such that the band gap energy of the semiconductor constituting the core becomes smaller than that of the shell. For example, a semiconductor made of Ag—In—S may have a band gap energy of about 1.8 eV to 1.9 eV.

Specifically, the semiconductor constituting the shell may have a band gap energy of, for example, 2.0 eV to 5.0 eV, particularly 2.5 eV to 5.0 eV. The band gap energy of the shell may be made larger than band gap energy of the core by, for example, about 0.1 eV to 3.0 eV, particularly about 0.3 eV to 3.0 eV, more particularly 0.5 eV to 1.0 eV. When a difference is equal to or greater than the lower limit between the band gap energy of the semiconductor constituting the shell and the band gap energy of the semiconductor constituting the core, the emission from the core has a reduced proportion of emission other than band edge emission so that the proportion of the band edge emission tends to increase.

Furthermore, the band gap energies of the semiconductors constituting the core and the shell are preferably selected to provide a type-I band alignment in which the band gap energy of the shell sandwiches the band gap energy of the core in heterojunction of the core and the shell. By forming the type-I band alignment, the band edge emission from the core can more favorably be obtained. In the type-I alignment, a barrier of at least 0.1 eV is preferably formed between the band gap of the core and the band gap of the shell and, for example, a barrier of 0.2 eV or more, or 0.3 eV or more, may be formed. The upper limit of the barrier may be, for example, 1.8 eV, particularly 1.1 eV. When the barrier is equal to or more than the lower limit, the emission from the core has a reduced proportion of emission other than band edge emission so that the proportion of the band edge emission tends to increase.

The semiconductor constituting the shell may contain In or Ga as the group 13 element. The shell may contain S as the group 16 element. The semiconductor containing In or Ga and the semiconductor containing S tend to be semiconductors having a larger band gap energy than the core described above.

The shell may have a crystal system of the semiconductor compatible with a crystal system of the semiconductor the core and may have the lattice constant the same as or close to that of the core semiconductor. The shell composed of a semiconductor with a compatible crystal system and a close lattice constant may cover the circumference of the core in a favorable manner. Here, it is noted that the lattice constant is considered to be close even when a multiple of the lattice constant of the shell is close to the lattice constant of the core. The shell may be amorphous.

Whether an amorphous shell is formed can be confirmed by observation of the semiconductor nanoparticle having the core-shell structure with HAADF-STEM. When the amorphous shell is formed, specifically, a portion having a regular pattern (e.g., a striped pattern or a dot pattern) is observed at a central part, and a portion not observed as a portion having a regular pattern is observed therearound with HAADF-STEM. According to HAADF-STEM, those having a regular structure such as a crystalline material are observed as an image having a regular pattern, and those having no regular structure such as an amorphous material are not observed as an image having a regular pattern. Therefore, when the shell is amorphous, the shell may be observed as a portion distinctively different from the core (having a crystal structure of a tetragonal system etc. as described above) observed as an image having a regular pattern.

When the shell is made of Ga—S, the shell tends to be observed as an image darker than the core in the image obtained by HAADF-STEM since Ga is an element lighter than Ag and In contained in the core.

Whether the amorphous shell is formed may also be confirmed by observation of the semiconductor nanoparticle having the core-shell structure of this embodiment with a high-resolution transmission electron microscope (HR-TEM). In an image obtained by HRTEM, a portion corresponding to the core is observed as a crystal lattice image (image having a regular pattern), and a portion corresponding to the shell is not observed as a crystal lattice image and is observed as a portion in which no regular pattern is visible although black and white contrast is observed.

On the other hand, the shell is preferably made of a semiconductor not forming a solid solution with the core. When the shell forms a solid solution with the core, both are integrated, which may prevent implementation of a mechanism of this embodiment in which the core is covered with the shell to change the surface state of the core so that the band edge emission is obtained.

The shell may contain a combination of In and S, a combination of Ga and S, or a combination of In, Ga, and S as a combination of the group 13 and group 16 elements; however, the present invention is not limited thereto. The combination of In and S may have a form of indium sulfide, the combination of Ga and S may have a form of gallium sulfide, and the combination of In, Ga, and S may be indium gallium sulfide. The indium sulfide constituting the shell may not have a stoichiometric composition ($In_2S_3$), and in this sense, indium sulfide may be represented by the formula $InS_x$ (where x is any number not limited to an integer, e.g., 0.8 to 1.5). Similarly, gallium sulfide may not have a stoichiometric composition ($Ga_2S_3$), and in this sense, gallium sulfide may be represented by the formula $GaS_x$, where x is any number not limited to an integer, e.g., 0.8 to 1.5. Indium gallium sulfide may have a composition represented by $In_{2(1-y)}Ga_{2y}S_3$, where y is any number greater than 0 and less than 1, or may be represented by $In_aGa_{1-a}S_b$, where a is any number greater than 0 and less than 1, and b is any numerical value not limited to an integer.

Indium sulfide has a band gap energy of 2.0 eV to 2.4 eV and has a lattice constant of 1.0775 nm (10.775 Å) when the crystal system is cubic. Gallium sulfide has a band gap energy of about 2.5 eV to 2.6 eV and has a lattice constant of 0.5215 nm (5.215 Å) when the crystal system is tetragonal. It is noted that all the crystal systems etc. described herein are reported values, and the shell may not always satisfy these reported values in the actual semiconductor nanoparticles having the core-shell structure. Indium sulfide and gallium sulfide may be preferably used as the semiconductor constituting the shell disposed on the surface of the core. Particularly, gallium sulfide may be preferably used since the band gap energy is larger. When gallium sulfide is used, stronger band edge emission may be obtained as compared to when indium sulfide is used.

The semiconductor constituting the shell may further contain an alkali metal ($M^{a}$) in addition to the group 13 and group 16 elements. The alkali metal contained in the semiconductor constituting the shell may contain at least lithium. When the semiconductor constituting the shell contains the alkali metal, the ratio of the number of atoms of the alkali metal to the sum of the numbers of atoms of the alkali metal and the group 13 element may be, for example, 0.01 or more and less than 1, or 0.1 to 0.9. The ratio of the number of atoms of the group 16 element to the sum of the numbers of atoms of the alkali metal and the group 13 element may be, for example, 0.25 to 0.75.

In the semiconductor nanoparticles having the core-shell structure, the core may have an average particle diameter of, for example, 10 nm or less, particularly 8 nm or less. The average particle diameter of the core may be in a range of 2 nm to 10 nm, particularly in a range of 2 nm to 8 nm. When the average particle diameter of the core is not more than the upper limit value, the quantum size effect may easily be obtained.

The thickness of the shell may be in the range of 0.1 nm to 50 nm, in the range of 0.1 nm to 10 nm, particularly in the range of 0.3 nm to 3 nm. When the thickness of the shell is not less than the lower limit value, the effect of the shell covering the core is sufficiently obtained, and the band edge emission is easily obtained.

The surface of the semiconductor nanoparticle may be modified with any compound. A compound for modifying the surface of the semiconductor nanoparticle is also referred to as a surface modifier. For example, the surface modifier may have at least one of functions of stabilize the semiconductor nanoparticles to prevent aggregation or growth of the semiconductor nanoparticles, improving the dispersibility of the semiconductor nanoparticles in a solvent, and compensating for surface defects of the semiconductor nanoparticles to improve light emission efficiency.

Examples of the surface modifier may include a nitrogen-containing compound with a hydrocarbon group having the carbon number of 4 to 20, a sulfur-containing compound with a hydrocarbon group having the carbon number of 4 to 20, an oxygen-containing compound with a hydrocarbon group having the carbon number of 4 to 20, a phosphorus-containing compound with a hydrocarbon group having the carbon number of 4 to 20, etc. Examples of the hydrocarbon group having the carbon number of 4 to 20 include saturated aliphatic hydrocarbon groups such as butyl group, isobutyl group, pentyl group, hexyl group, octyl group, ethylhexyl group, decyl group, dodecyl group, hexadecyl group, and octadecyl group; unsaturated aliphatic hydrocarbon groups such as oleyl group; alicyclic hydrocarbon groups such as cyclopentyl group and cyclohexyl group; aromatic hydrocarbon groups having the carbon number of 6 to 10 such as phenyl group and naphthyl group; and arylalkyl groups such as benzyl group and naphthylmethyl group, and among them, the saturated aliphatic hydrocarbon groups and the unsaturated aliphatic hydrocarbon groups are preferable. Examples of the nitrogen-containing compound include amines, amides etc., examples of the sulfur-containing compound comprise thiols etc., examples of the oxygen-containing compound include fatty acids etc., and examples of the phosphorus-containing compound include phosphines, phosphine oxides, etc.

The surface modifier is preferably the nitrogen-containing compound with a hydrocarbon group having the carbon number of 4 to 20. Examples of such a nitrogen-containing compound include alkylamines such as butylamine, isobutylamine, pentylamine, hexylamine, octylamine, ethylhexylamine, decylamine, dodecylamine, hexadecylamine, and octadecylamine, and alkenylamines such as oleylamine.

The surface modifier is also preferably the sulfur-containing compound with a hydrocarbon group having the carbon number of 4 to 20. Examples of such a sulfur-containing compounds include butanethiol, isobutanethiol, pentanethiol, hexanethiol, octanethiol, ethylhexanethiol, decanethiol, dodecanethiol, hexadecanethiol, and octadecanethiol.

The surface modifier may be used alone, or two or more different surface modifiers may be used in combination. For example, one compound selected from the nitrogen-containing compounds exemplified above (e.g., oleylamine) and one compound selected from the sulfur-containing compounds exemplified above (e.g., dodecanethiol) may be used in combination.

When the semiconductor nanoparticle has a core-shell structure, the shell surface may be modified with a surface modifier, hereinafter also referred to as a "specific modifier", containing phosphorus (P) having a negative oxidation number. When the surface modifier of the shell contains the specific modifier, the quantum efficiency is further improved in the band edge emission of the semiconductor nanoparticle having a core-shell structure.

The specific modifier contains P having a negative oxidation number as a group 15 element. The oxidation number of P is reduced by 1 when one hydrogen atom or hydrocarbon group is bonded to P and is increased by 1 when one oxygen atom is bonded by a single bond, changing depending on the substitution state of P. For example, the oxidation number of P is −3 in trialkylphosphine and triarylphosphine and is −1 in trialkylphosphine oxide and triarylphosphine oxide.

The specific modifier may contain another group 15 element in addition to P having a negative oxidation number. Examples of the other group 15 element include N, As, Sb, etc.

The specific modifier may be, for example, a phosphorus-containing compound with a hydrocarbon group having the carbon number of 4 to 20. Examples of the hydrocarbon group having the carbon number of 4 to 20 include linear or branched saturated aliphatic hydrocarbon groups such as n-butyl group, isobutyl group, n-pentyl group, n-hexyl group, octyl group, ethylhexyl group, decyl group, dodecyl group, tetradecyl group, hexadecyl group, and octadecyl group; linear or branched unsaturated aliphatic hydrocarbon groups such as oleyl group; alicyclic hydrocarbon groups such as cyclopentyl group and cyclohexyl group; aromatic hydrocarbon groups such as phenyl group and naphthyl group; and arylalkyl group such as benzyl group and naphthylmethyl group, and among them, the saturated aliphatic hydrocarbon groups and the unsaturated aliphatic hydrocarbon groups are preferable. When the specific modifier has multiple hydrocarbon groups, the hydrocarbon groups may be the same or different.

Specific examples of the specific modifier include tributylphosphine, triisobutylphosphine, tripentylphosphine, trihexylphosphine, trioctylphosphine, tris(ethylhexyl)phosphine, tridecylphosphine, tridodecylphosphine, tritetradecylphosphine, trihexadecylphosphine, trioctadecylphosphine, triphenylphosphine, tributylphosphine oxide, triisobutylphosphine oxide, tripentylphosphine oxide, trihexylphosphine oxide, trioctylphosphine oxide, tris(ethylhexyl)phosphine oxide, tridecylphosphine oxide, tridodecylphosphine oxide, tritetradecylphosphine oxide, trihexadecylphosphine oxide, trioctadecylphosphine oxide, triphenylphosphine oxide, and at least one selected from the group consisting thereof is preferable.

Method for Manufacturing Semiconductor Nanoparticle

A method for manufacturing a semiconductor nanoparticle may include a preparation step of preparing a first mixture containing an Ag salt, an alkali metal salt, a salt containing at least one of In and Ga, a sulfur source, and an organic solvent, and a heat treatment step of performing a heat treatment of the first mixture to obtain semiconductor nanoparticles. In the manufacturing method, the ratio of the number of atoms of alkali metal to the total number of atoms of Ag and alkali metal in the first mixture may be greater than 0 and less than 1.

The salt containing at least one of In and Ga in the first mixture may contain at least one of an In salt and a Ga salt, and the alkali metal salt may contain a lithium salt. The first mixture may further contain a selenium (Se) source as necessary.

A ratio ($M^a/(M^a+Ag)$) of the number of atoms of the alkali metal ($M^a$) to the total number of atoms of Ag and the alkali metal ($M^a$) in the first mixture is, for example, less than 1, 0.85 or less, or 0.35 or less. The ratio is, for example, greater than 0, 0.1 or more, or 0.15 or more. Therefore, one of the features of the manufacturing method of this embodiment may be that the semiconductor nanoparticle is generated by substituting the alkali metal for a portion of Ag in the composition.

The semiconductor nanoparticle may be manufactured by performing a heat treatment of the first mixture prepared by putting the Ag salt, the alkali metal salt, the salt containing at least one of In and Ga, the sulfur source, and, optionally at least one selenium source into an organic solvent at one time. According to this method, the semiconductor nanoparticle may be synthesized by a simple operation in a single pot with high reproducibility. Alternatively, the semiconductor nanoparticle may be manufactured by a method comprising reacting the organic solvent with the Ag salt and the alkali metal salt to form a complex, then reacting the organic solvent with the salt containing at least one of In and Ga to form a complex, and performing crystal growth of a reaction product obtained by reacting these complexes with the sulfur source. In this case, the heat treatment may be performed at the stage of reaction with the sulfur source.

Any of the Ag salt, the alkali metal salt, and the salt containing at least one of In and Ga may be an organic acid salt or an inorganic acid salt. Specifically, examples of the salt include nitrate, acetate, sulfate, hydrochloride, sulfonate, acetylacetonate salts, and the salt is preferably at least one selected from the group consisting thereof, more preferably the organic acid salt such as acetate. This may be because the organic acid salt has high solubility in an organic solvent and facilitates a more uniform reaction.

Examples of the sulfur source include elemental sulfur, thiourea, alkylthiourea, thioacetamide, alkylthiol, 2,4-bis(4-methoxyphenyl)-1,3,2,4-dithiadiphosphetan-2,4-disulfide, β-dithiones such as 2,4-pentanedithione, dithiols such as 1,2-bis(trifluoromethyl)ethylene-1,2-dithiol, and sulfur-containing compounds such as diethyldithiocarbamate.

Examples of the Se supply source include elemental selenium, and Se-containing compounds such as selenourea, selenoacetamide, and alkyl selenol.

The first mixture may contain the Ag salt, the alkali metal salt, the salt containing at least one of In and Ga, the sulfur source, and, optionally at least one Se source without a mutual reaction or as a complex formed therefrom. The mixture may contain an Ag complex formed from the Ag salt, a complex formed from the salt containing at least one of In and Ga, a complex formed from the sulfur source, etc. Complex formation is performed by, for example, mixing the Ag salt, the alkali metal salt, the salt containing at least one of In and Ga, and the sulfur source in a suitable solvent.

Examples of the organic solvent include amines with a hydrocarbon group having the carbon number of 4 to 20, particularly alkylamines or alkenylamines having the carbon number of 4 to 20, thiols with a hydrocarbon group having the carbon number of 4 to 20, particularly alkyl thiols or alkenyl thiols having the carbon number of 4 to 20, phosphines with a hydrocarbon group having the carbon number of 4 to 20, particularly alkyl phosphines or alkenyl phosphines having the carbon number of 4 to 20, etc., and at least one selected from the group consisting thereof is preferably contained. These organic solvents may finally modify the surface of the obtained semiconductor nanoparticle, for example. Two or more of the organic solvents may be used in combination, and particularly, at least one selected from thiols with a hydrocarbon group having the carbon number of 4 to 20 and amines with a hydrocarbon group having the carbon number of 4 to 20 may be combined and used as a mixed solvent. These organic solvents may also be used as a mixture with other organic solvents. When the organic solvent contains the thiol and the amine, the content volume ratio of the thiol to the amine (thiol/amine) is, for example, greater than 0 and 1 or less, preferably 0.007 to 0.2.

In the first mixture, the ratio $((Ag+M^\alpha)/(In+Ga))$ of the total number of atoms of Ag and $M^\alpha$ to the total number of atoms of In and Ga contained in the composition may be, for example, 0.1 to 2.5, preferably 0.2 to 2.0, more preferably 0.3 to 1.5. In the composition of the first mixture, the ratio $(In/(In+Ga))$ of the number of atoms of In to the total number of atoms of In and Ga may be, for example, 0.1 to 1.0, preferably 0.25 to 0.99. In the composition of the mixture, a ratio $((Ag+M^\alpha)/S)$ of the total number of atoms of Ag and $M^\alpha$ to the total number of atoms of S may be, for example, 0.27 to 1.0, preferably 0.35 to 0.5. By using the supply sources of the elements so that the composition of the mixture satisfies these conditions, the semiconductor nanoparticles easily providing the band edge emission may be generated.

When the first mixture contains the Se source, a ratio $(S/(Se+S))$ of the number of atoms of S to the sum of the numbers of atoms of S and Se in the first mixture may be, for example, less than 1, preferably 0.95 or less, or 0.9 or less. The ratio may be, for example, greater than 0, preferably 0.1 or more, or 0.4 or more.

The heat treatment step may be a one-stage heat treatment step in which the first mixture is heat-treated at a predetermined temperature or may be a two-stage heat treatment step in which a heat treatment at a first temperature is followed by a heat treatment at a second temperature higher than the first temperature. By performing the heat treatment in two stages, for example, the semiconductor nanoparticle with relatively high band edge emission intensity may be manufactured with better reproducibility. The heat treatment at the first temperature and the heat treatment at the second temperature may be performed continuously, or the heat treatment at the first temperature may be followed by a temperature reduction and a subsequent temperature raise to the second temperature before the heat treatment.

When the heat treatment of the first mixture is performed in the two-stage heat treatment step, the first temperature may be, for example, 30° C. or more, and is preferably 100° C. or more. The first temperature may be, for example, 200° C. or less, and is preferably 180° C. or less. The time of the heat treatment at the first temperature may be, for example, 1 minute or more, and is preferably 5 minutes or more, more preferably 10 minutes or more. The time of the heat treatment at the first temperature may be, for example, 120 minutes or less, and is preferably 60 minutes or less, more preferably 30 minutes or less, further preferably 15 minutes or less.

The second temperature may be, for example, 180° C. or more, and is preferably 200° C. or more. The second temperature may be, for example, 370° C. or less, and is preferably 350° C. or less. The time of the heat treatment at the second temperature may be, for example, 1 minute or more, and is preferably 2 minutes or more, more preferably 5 minutes or more. The time of the heat treatment at the second temperature may be, for example, 120 minutes or less, and is preferably 60 minutes or less, more preferably 30 minutes or less, further preferably 15 minutes or less.

Regarding the time of the heat treatment, a start time of the heat treatment is defined as a time point when a predetermined temperature is reached, and an end time point of the heat treatment at the predetermined temperature is defined as a time point when an operation for reducing or increasing the temperature is performed. A temperature increase rate until reaching the predetermined temperature may be, for example, 1° C./min to 100° C./min, or 1° C./min to 50° C./min. A temperature reduction rate after the heat treatment may be, for example, 1° C./min to 100° C./min, and cooling may be performed as necessary, or a heat source may simply be stopped for allowing to cool.

An atmosphere in the heat treatment step is preferably an inert atmosphere such as a rare gas atmosphere of argon etc. or a nitrogen atmosphere. The heat treatment in an inert atmosphere may suppress by-production of an oxide and oxidation of an obtained semiconductor nanoparticle surface.

The semiconductor nanoparticles obtained by the heat treatment may be separated from the organic solvent and may further be purified as necessary. For example, the semiconductor nanoparticles may be separated by centrifuging the organic solvent containing the semiconductor nanoparticles after completion of the heat treatment step and extracting a supernatant liquid containing the nanoparticles. The purification includes, for example, adding an organic solvent such as alcohol to the supernatant liquid and centrifuging the liquid to extract the semiconductor nanoparticles as precipitate. The precipitate may be extracted as it is or may be extracted by removing the supernatant liquid. The extracted precipitate may be dried by, for example, vacuum deaeration or natural drying, or a combination of vacuum deaeration and natural drying. The natural drying may be performed by leaving the precipitate in the atmosphere at normal temperature and normal pressure, for example, and in this case, the precipitate may be left for 20 hours or more, for example, about 30 hours.

Alternatively, the extracted precipitate may be dispersed in an organic solvent. The purification process comprising the addition of alcohol and the centrifugation may be performed multiple times as necessary. The alcohol used for purification may be a lower alcohol such as methanol, ethanol, or propanol. When the precipitate is dispersed in an organic solvent, the organic solvent may be a halogen solvent such as chloroform or a hydrocarbon solvent such as toluene, cyclohexane, hexane, pentane, or octane.

Method for Manufacturing Core-Shell Type Semiconductor Nanoparticle

The method for manufacturing a core-shell type semiconductor nanoparticle may be a manufacturing method including a preparation step of mixing the semiconductor nanoparticles obtained by the method for manufacturing a semiconductor nanoparticle, a compound containing a group 13 element, a simple substance of a group 16 element or a compound containing a group 16 element, and an organic solvent to obtain a second mixture, and a shell forming step of performing a heat treatment of the second mixture. Therefore, the method for manufacturing a core-shell type semiconductor nanoparticle may be a manufacturing method including a first preparation step of preparing a first mixture containing an Ag salt, an alkali metal salt, a salt containing at least one of In and Ga, a sulfur source, and an organic solvent, a heat treatment step of performing a heat treatment of the first mixture to obtain semiconductor nanoparticles, a second preparation step of mixing the semiconductor nanoparticles, a compound containing a group 13 element, a simple substance of a group 16 element or a compound containing a group 16 element, and an organic solvent to obtain a second mixture, and a shell forming step of performing a heat treatment of the second mixture to obtain a core-shell type semiconductor nanoparticle, and may be the manufacturing method in which the ratio of the number of atoms of alkali metal to the total number of atoms of Ag and alkali metal in the first mixture is greater than 0 and less than 1.

The semiconductor nanoparticles may constitute the second mixture as a dispersion. Since no scattered light is generated in a liquid in which the semiconductor nanoparticles are dispersed, the dispersion is generally obtained as a transparent (colored or colorless) liquid. A solvent for dispersing the semiconductor nanoparticles may be any organic solvent as with the production of the semiconductor nanoparticles, and the organic solvent may be a surface modifier or a solution containing a surface modifier. For example, the organic solvent may be at least one selected from nitrogen-containing compounds with a hydrocarbon group having the carbon number of 4 to 20, which is the surface modifier described in relation to the method for manufacturing a semiconductor nanoparticle, or may be at least one selected from sulfur-containing compounds with a hydrocarbon group having the carbon number of 4 to 20, or may be a combination of at least one selected from nitrogen-containing compounds with a hydrocarbon group having the carbon number of 4 to 20 and at least one selected from sulfur-containing compounds with a hydrocarbon group having the carbon number of 4 to 20. Particularly, the nitrogen-containing compound preferably has a higher boiling point than a reaction temperature and includes oleylamine, n-tetradecylamine, and a combination thereof, since a compound with particularly high purity is easily available and the boiling point exceeds 290° C. Specific examples of the organic solvent include oleylamine, n-tetradecylamine, dodecanethiol, or a combination thereof.

The dispersion of the semiconductor nanoparticles may be prepared such that the concentration of particles in the dispersion is, for example, $5.0 \times 10^{-8}$ mol/liter to $5.0 \times 10^{-4}$ mol/liter, particularly $1.0 \times 10^{-7}$ mol/liter to $5.0 \times 10^{-5}$ mol/liter. When the proportion of particles in the dispersion is too small, it may be difficult to recover a product thorough a coagulation/precipitation process using a poor solvent, and when the proportion is too large, a rate of fusion may increase due to Ostwald ripening and collision of a material constituting the core, so that the particle diameter distribution tends to be wider.

The compound containing a group 13 element serves as a group 13 element source and may be, for example, an organic acid salt, an inorganic acid salt, or an organic metal compound of a group 13 element. Examples of the compound containing a group 13 element include nitrates, acetates, sulfates, hydrochlorides, sulfonates, acetylacetonate complexes, etc., and the compound may be preferably an organic acid salt such as acetate or an acetylacetonate complex, or an organometallic compound. This may be because the organic acid salt and the organometallic compound have high solubility in an organic solvent and facilitate a more uniform reaction.

The compound containing a group 13 element may be a salt containing at least one of indium (In) and gallium (Ga). The salt may be an organic salt such as acetate or an acetylacetonate complex, or an inorganic salt such as sulfate, hydrochloride, or sulfonate. Preferably, the salt may be an organic salt such as acetate or an acetylacetonate complex.

The simple substance of a group 16 element or the compound containing a group 16 element serves as a group 16 element source. For example, when sulfur (S) is used as the group 16 element for a constituent element of the shell, the sulfur source may be elemental sulfur such as high-purity sulfur, or thiol such as n-butanethiol, isobutanethiol, n-pentanethiol, n-hexanethiol, octanethiol, decanethiol, dodecanethiol, hexadecanethiol, and octadecanethiol, disulfide such as dibenzyldisulfide, thiourea, alkylthiourea such as 1,3-dimethylthiourea, a sulfur-containing compound such as a thiocarbonyl compound, etc. Among them, when thiourea, alkylthiourea, etc. are used as the sulfur source, a shell is sufficiently formed, so that the semiconductor nanoparticle providing strong band edge emission is easily obtained.

When oxygen (O) is used as the group 16 element for a constituent element of the shell, alcohol, ether, carboxylic acid, ketone, or an N-oxide compound may be used as the group 16 element source. When selenium (Se) is used as the group 16 element for a constituent element of the shell, elemental selenium or selenide phosphine oxide, an organic selenium compound (dibenzyl diselenide or diphenyl diselenide), or a compound such as hydride may be used as the group 16 element source. When tellurium (Te) is used as the group 16 element for a constituent element of the shell, elemental tellurium, telluride phosphine oxide, or hydride may be used as the group 16 element source.

The second mixture may contain an alkali metal salt in addition to the group 13 and group 16 element sources. The alkali metal includes lithium (Li), sodium (Na), potassium (K), rubidium (Rb), cesium (Cs). The alkali metal salt may be either an organic acid salt or an inorganic acid salt. Specifically, examples of the salt include nitrate, acetate, sulfate, hydrochloride, sulfonate, acetylacetonate salts, etc., and the salt is preferably at least one selected from the group consisting thereof, more preferably the organic acid salt such as acetate.

A preparation ratio of the group 13 element source and the group 16 element source in the second mixture may be determined in accordance with a stoichiometric composition ratio of a compound semiconductor composed of the group 13 element and the group 16 element or may not necessarily be the stoichiometric composition ratio. For example, the preparation ratio of the group 16 element to the group 13 element can be set to 0.75 to 1.5.

When the second mixture contains the alkali metal salt, the preparation ratio of the alkali metal salt to the group 13 element source may be, for example, 0.1 to 5, or 0.2 to 4. The preparation ratio of the group 16 element source to the sum of the alkali metal salt and the group 13 element source may be, for example, 0.3 to 3, or 0.5 to 2.

Preparation amounts of the group 13 element source, the group 16 element source, and optionally the alkali metal salt contained in the second mixture may be selected in consideration of an amount of the semiconductor nanoparticles contained in the dispersion such that the shells having a desired thickness are formed on the semiconductor nanoparticles present in the dispersion. For example, the preparation amounts of the group 13 element source and the group 16 element source may be decided such that a semiconductor compound having a stoichiometric composition composed of the group 13 element and the group 16 element is generated in 0.1 µmol to 10 mmol, particularly 5 µmol to 1 mmol, when the semiconductor nanoparticles have an amount of substance as particles of 10 nmol. It is noted that the amount of substance as particles is a molar amount when one particle is regarded as a huge molecule and is equal to a value obtained by dividing the number of nanoparticles contained in the dispersion by the Avogadro number (NA=6.022×10$^{23}$).

Regarding the method for manufacturing a core-shell type semiconductor nanoparticle, a shell layer may be formed by a method comprising: increasing the temperature of the dispersion containing the semiconductor nanoparticles so that the peak temperature is 200° C. to 350° C.; after attaining the peak temperature, adding a mixed liquid obtained by dispersing or dissolving the group 13 element source, the group 16 element source, and optionally the alkali metal salt in an organic solvent in advance, little by little while the peak temperature is maintained; and subsequently reducing the temperature, that is slow injection method. In this case, the heat treatment is started immediately after the dispersion containing semiconductor nanoparticles and the mixed liquid are mixed to obtain the second mixture. The mixed liquid may be added at a rate of 0.1 mL/hour to 10 mL/hour, particularly 1 mL/hour to 5 mL/hour. The peak temperature may be maintained as necessary even after the addition of the mixed liquid is completed.

When the peak temperature is equal to or higher than the temperature described above, the surface modifier modifying the semiconductor nanoparticles is sufficiently desorbed, or a chemical reaction for shell formation sufficiently progresses, so that a semiconductor layer (shell) tends to be sufficiently formed. When the peak temperature is equal to or less than the temperature described above, deterioration of the semiconductor nanoparticles is suppressed, and the favorable band edge emission tends to be obtained. The time for maintaining the peak temperature may be 1 minute to 300 minutes, or particularly 10 minutes to 120 minutes in total from the start of the addition of the mixed liquid. The retention time of the peak temperature is selected in relation to the peak temperature, and a favorable shell layer is likely to be formed by making the retention time longer when the peak temperature is lower and making the retention time shorter when the peak temperature is higher. A temperature increase rate and a temperature reduction rate are not particularly limited, and the temperature may be reduced by, for example, stopping the heating by a heating source, such as an electric heater, for allowing to cool after maintaining the peak temperature for a predetermined time.

Alternatively, regarding the method for manufacturing a core-shell type semiconductor nanoparticle, a dispersion containing the semiconductor nanoparticles may be mixed with the group 13 element source, the group 16 element source, and optionally the alkali metal salt to obtain the second mixture, and the second mixture may be heat-treated to form a semiconductor layer serving as a shell on the surfaces of the semiconductor nanoparticles, that is heating-up method. Specifically, the second mixture may be heated in such a manner that the temperature is gradually increased to the peak temperature of 200° C. to 310° C., which is maintained for 1 minute to 300 minutes before the temperature is gradually reduced. The temperature increase rate may be, for example, 1° C./min to 50° C./min; however, to minimize the deterioration of the core caused by the heat treatment continuously performed without a shell, the rate of temperature increase to 200° C. may be preferably 50° C./min to 100° C./Min. If it is desired to further increase the temperature to 200° C. or higher, the subsequent rate may be preferably set to 1° C./min to 5° C./min. The temperature reduction rate may be, for example, 1° C./min to 50° C./min. The predetermined peak temperature within the range is advantageous as described with respect to the slow injection method.

The heating-up method tends to provide the core-shell type semiconductor nanoparticle providing stronger band edge emission as compared to when the shell is formed by the slow injection method.

In either method, the preparation ratio of the group 13 element source and the group 16 element source may be determined in accordance with a stoichiometric composition ratio of a compound semiconductor composed of the group 13 element and the group 16 element or may not necessarily be the stoichiometric composition ratio. For example, the preparation ratio of the group 16 element to the group 13 element may be set to 0.75 to 1.5.

The preparation amounts are selected in consideration of an amount of the semiconductor nanoparticles contained in the dispersion such that the shells having a desired thickness are formed on the semiconductor nanoparticles present in the dispersion. For example, the preparation amounts of the group 13 element source and the group 16 element source may be decided such that a compound semiconductor having a stoichiometric composition composed of the group 13 element and the group 16 element is generated in 0.1 µmol to 10 mmol, particularly 5 µmol to 1 mmol, when the semiconductor nanoparticles have an amount of substance as particles of 10 nmol. It is noted that the amount of substance as particles is a molar amount when one particle is regarded as a huge molecule and is equal to a value obtained by dividing the number of nanoparticles contained in the dispersion by the Avogadro number (NA=6.022×10$^{23}$).

In the method for manufacturing a core-shell type semiconductor nanoparticle, a shell containing indium sulfide or gallium sulfide is preferably formed by using indium acetate or gallium acetylacetonate as the group 13 element source, using elemental sulfur, thiourea, or dibenzyl disulfide as the group 16 element source, and using a mixed liquid of oleylamine and dodecanethiol as the dispersion.

The use of the mixed liquid of oleylamine and dodecanethiol as the dispersion in the heating-up method provides the core-shell type semiconductor nanoparticle providing an emission spectrum in which an intensity of a broad peak derived from defect emission is sufficiently smaller than the intensity of the peak of the band edge emission. This tendency is significantly recognized even when a gallium source is used as the group 13 element source.

In this way, the shell is formed to form the core-shell type semiconductor nanoparticle having a core-shell structure. The obtained core-shell type semiconductor nanoparticle having a core-shell structure may be separated from the solvent and may further be purified and dried as necessary. The methods of separation, purification, and drying are as described above in relation to the semiconductor nanoparticle and therefore will not be described in detail.

When the shell surface of the core-shell type semiconductor nanoparticle is modified with the specific modifier, the core-shell type semiconductor nanoparticle obtained as described above may be subjected to a modification step. In the modification step, the core-shell type semiconductor nanoparticle is brought into contact with the specific modifier containing phosphorus (P) having a negative oxidation number to modify the shell surface of the core-shell particle. This leads to manufacturing of the core-shell type semiconductor nanoparticles exhibiting the band edge emission with a more excellent quantum yield.

For example, the contact between the core-shell type semiconductor nanoparticle and the specific modifier may be achieved by mixing the dispersion of the core-shell type semiconductor nanoparticles and the specific modifier. Alternatively, the contact may be achieved by mixing the core-shell particles with the specific modifier in a liquid form. The specific modifier may be a solution thereof. The dispersion of the core-shell type semiconductor nanoparticles is obtained by mixing the core-shell type semiconductor nanoparticles and an appropriate organic solvent. Examples of the organic solvent used for dispersion may include halogen solvents such as chloroform; aromatic hydrocarbon solvents such as toluene; aliphatic hydrocarbon solvents such as cyclohexane, hexane, pentane, and octane. The concentration of the amount of substance in the dispersion of the core-shell type semiconductor nanoparticles is, for example, $1\times10^{-7}$ mol/L to $1\times10^{-3}$ mol/L, preferably $1\times10^{-6}$ mol/L to $1\times10^{-4}$ mol/L.

An amount of the specific modifier used for the core-shell type semiconductor nanoparticle is 1 to 50,000 times by molar ratio, for example. In the case of using the dispersion of the core-shell type semiconductor nanoparticles in which the concentration of the amount of substance in the dispersion of the core-shell type semiconductor nanoparticles is $1.0\times10^{-7}$ mol/L to $1.0\times10^{-3}$ mol/L, the dispersion and the specific modifier may be mixed at a volume ratio of 1:1000 to 1000:1.

The temperature at the time of contact between the core-shell type semiconductor nanoparticle and the specific modifier is, for example, $-100°$ C. to $100°$ C., or $30°$ C. to $75°$ C. The contact time may appropriately be selected depending on the amount of the specific modifier used, the concentration of the dispersion, etc. The contact time is, for example, 1 minute or more, preferably 1 hour or more, and is 100 hours or less, preferably 48 hours or less. The atmosphere at the time of contact is, for example, an inert gas atmosphere of nitrogen gas or rare gas.

Light Emitting Device

A light emitting device includes a light conversion member and a semiconductor light emitting element and the light conversion member includes the semiconductor nanoparticles described above. According to this light emitting device, for example, a portion of the light emitted from the semiconductor light emitting element is absorbed by the semiconductor nanoparticles so that light having a longer wavelength than that of the semiconductor light emitting element is emitted. The light from the semiconductor nanoparticles and the remainder of the light emitted from the semiconductor light emitting element are mixed, and the mixed light may be utilized as the light emission of the light emitting device.

Specifically, by using the semiconductor light emitting element emitting blue-violet light or blue light having a peak wavelength of about 400 nm to 490 nm and using the semiconductor nanoparticles absorbing blue light to emit yellow light, the light emitting device emitting white light may be obtained. Alternatively, a white light emitting device may be obtained by using two types of the semiconductor nanoparticles absorbing blue light to emit green light and absorbing blue light to emit red light.

Alternatively, even in the case of using the semiconductor light emitting element emitting ultraviolet light having a peak wavelength of 400 nm or less and using three types of the semiconductor nanoparticles absorbing ultraviolet light to respectively emit blue light, green light, and red light, a white light emitting device may be obtained. In this case, all the light from the light emitting element is desirably absorbed and converted by the semiconductor nanoparticles so as not to leak the ultraviolet light emitted from the light emitting element to the outside.

Alternatively, by using the semiconductor light emitting element emitting blue-green light having a peak wavelength of about 490 nm to 510 nm and using the semiconductor nanoparticles absorbing the blue-green light to emit red light, the device emitting white light may be obtained.

Alternatively, by using the semiconductor light emitting element emitting red light having a wavelength of 700 nm to 780 nm and using the semiconductor nanoparticles absorbing red light to emit near infrared light, the light emitting device emitting near infrared light may be obtained.

The semiconductor nanoparticles may be used in combination with other semiconductor quantum dots or may be used in combination with a phosphor (e.g., organic phosphor or inorganic phosphor) that is not other quantum dots. The other semiconductor quantum dots may be, for example, the binary semiconductor quantum dots described in Description of the Related Art. For the phosphor that is not quantum dots, a garnet phosphor such as an aluminum garnet phosphor may be used. Examples of the garnet phosphor include yttrium aluminum garnet phosphors activated with cerium and lutetium aluminum garnet phosphors activated with cerium. Other examples of the phosphor include nitrogen-containing calcium aluminosilicate phosphors activated with europium and/or chromium, silicate phosphors activated with europium, $\beta$-SiAON phosphors, nitride phosphors such as CASN or SCASN, rare earth nitride phosphors such as $LnSi_3N_{11}$ or LnSiAlON, oxynitride phosphors such as $BaSi_2O_2N_2$:Eu or $Ba_3Si_6O_{12}N_2$:Eu, sulfide phosphors such as CaS, $SrGa_2S_4$, $SrAl_2O_4$, and ZnS, chlorosilicate phosphors, $SrLiAl_3N_4$:Eu phosphors, $SrMg_3SiN_4$:Eu phosphors, $K_2SiF_6$:Mn phosphors as fluoride complex phosphors activated with manganese, etc.

In the light emitting device, the light conversion member including the semiconductor nanoparticles may be, for example, a sheet- or plate-shaped member, or may be a member having a three-dimensional shape. An example of the member having a three-dimensional shape may be a sealing member in a surface-mounted light emitting diode, and when the semiconductor light emitting element is disposed on a bottom surface of a concave portion formed in a package, the sealing member is formed by filling the concave portion with a resin so as to seal the light emitting element.

When the semiconductor light emitting device is disposed on a flat substrate, another example of the light conversion member may be a resin member formed to surround upper and side surfaces of the semiconductor light emitting device with a substantially uniform thickness. Alternatively, when a resin member including a reflecting material is filled around the semiconductor light emitting element so that the upper end thereof is flush with the semiconductor light emitting element, a further example of the light conversion member may be a resin member formed into a flat plate shape with a predetermined thickness on upper portions of the semiconductor light emitting element and the resin member comprising the reflecting material.

The light conversion member may be in contact with the semiconductor light emitting element or may be disposed away from the semiconductor light emitting element. Specifically, the light conversion member may be a pellet-shaped member, a sheet member, a plate-shaped member, or a rod-shaped member disposed away from the semiconductor light emitting element, or a member disposed in contact with the semiconductor light emitting element, for example, a sealing member, a coating member, that is a member covering the light emitting element additionally disposed on a mold member, or a mold member, that includes a member having, for example, a lens shape.

When two or more types of the semiconductor nanoparticles emitting light at different wavelengths are used in the light emitting device, the two or more types of the semiconductor nanoparticles may be mixed in one light conversion member, or two or more light conversion members each including only one type of quantum dots may be used in combination. In this case, the two or more types of the light conversion members may have a laminated structure or may be arranged as a dot- or stripe-shaped pattern on a plane.

An example of the semiconductor light emitting element includes an LED chip. The LED chip may include a semiconductor layer composed of one or more selected from the group consisting of GaN, GaAs, InGaN, AlInGaP, GaP, SiC, ZnO, etc. The semiconductor light emitting element emitting blue-violet light, blue light, or ultraviolet light includes, for example, a GaN-based compound having a composition represented by $In_XAl_YGa_{1-X-Y}N$ ($0 \leq X$, $0 \leq Y$, $X+Y<1$) as the semiconductor layer.

The light emitting device may be preferably incorporated as a light source in a liquid crystal display device. Since the band edge emission by semiconductor nanoparticles has a short emission lifetime, the light emitting device using the nanoparticles is suitable for a light source of a liquid crystal display device required to have a relatively fast response speed. Additionally, the semiconductor nanoparticle of this embodiment may exhibit a light emission peak with a small half-value width for the band edge emission. Therefore, in the light emitting device, a blue semiconductor light emitting element is used for obtaining blue light having a peak wavelength in a range of 420 nm to 490 nm, and the semiconductor nanoparticles are used for obtaining green light having a peak wavelength in a range of 510 nm to 550 nm, preferably 530 nm to 540 nm, and red light having a peak wavelength in a range of 600 nm to 680 nm, preferably 630 nm to 650 nm. Alternatively, in the light emitting device, the semiconductor light emitting element is used for obtaining ultraviolet light having a peak wavelength of 400 nm or less, and the semiconductor nanoparticles are used for obtaining blue light having a peak wavelength in a range of 430 nm to 470 nm, preferably 440 nm to 460 nm, green light having a peak wavelength of 510 nm to 550 nm, preferably 530 nm to 540 nm, and red light having a peak wavelength in a range of 600 nm to 680 nm, preferably 630 nm to 650 nm. As a result, a liquid crystal display device with good color reproducibility may be obtained without using a dark color filter. For example, the light emitting device may be used as a direct type backlight or an edge type backlight.

Alternatively, a sheet, a plate-shaped member, or a rod made of resin or glass etc. and containing the semiconductor nanoparticles may be incorporated in a liquid crystal display device as a light conversion member independent of the light emitting device.

EXAMPLES

The present invention will hereinafter specifically be described with examples; however, the present invention is not limited to these examples.

Example 1

Fabrication of Semiconductor Nanoparticles

In a mixed liquid of 0.1 cm$^3$ of 1-dodecanethiol and 2.9 cm$^3$ of oleylamine, 0.05 mmol of silver acetate (AgOAc), 0.05 mmol of lithium acetate (LiOAc), 0.1 mmol of indium acetate (In(OAc)$_3$), and 0.2 mmol of thiourea serving as the sulfur source were charged and dispersed. The dispersion was put into a test tube together with a stirrer chip, and nitrogen substitution was performed and followed by a heat treatment performed at 150° C. for 10 minutes as a first stage heat treatment and at 300° C. for 10 minutes as a second stage heat treatment in a nitrogen atmosphere while the contents in the test tube were stirred. After the heat treatment, an obtained suspension was allowed to cool and then centrifuged (radius: 146 mm, 4000 rpm, 5 minutes), and a precipitate was taken out. Addition of 3 ml of methanol thereto was followed by centrifugation (radius: 146 mm, 4000 rpm, 5 minutes) to precipitate semiconductor nanoparticles, and the supernatant was discarded. Further addition of 3 ml of ethanol was followed by centrifugation under the same conditions to precipitate semiconductor nanoparticles. The precipitate was taken out, dried, and then dispersed in chloroform to obtain a semiconductor nanoparticle dispersion.

Example 2, and Comparative Examples 1, 2

Semiconductor nanoparticle dispersions were obtained as in Example 1 except that the raw material preparation compositions were changed as shown in Table 1.

TABLE 1

|  | AgOAc (mmol) | LiOAc (mmol) | In(acac)$_3$ (mmol) | (NH$_2$)$_2$CS (mmol) |
| --- | --- | --- | --- | --- |
| Example 1 | 0.05 | 0.05 | 0.1 | 0.2 |
| Example 2 | 0.07 | 0.03 | 0.1 | 0.2 |
| Comparative Example 1 | 0.1 | — | 0.1 | 0.2 |
| Comparative Example 2 | — | 0.1 | 0.1 | 0.2 |

Average Particle Diameter

The shapes of the semiconductor nanoparticles obtained in Examples 1, 2 and Comparative Examples 1, 2 were observed by using a transmission electron microscope (TEM, manufactured by Hitachi High-Technologies Corporation, trade name: H-7650), and the average particle diameter thereof was measured from 80,000× to 200,000×TEM images. For a TEM grid, High-Resolution Carbon Film (product name) HRC-C10 STEM Cu100P grid (Okenshoji Co., Ltd) was used. The shapes of the obtained particles were spherical or polygonal. The average particle diameter was obtained by a method including selecting TEM images of three or more positions, measuring particle diameters of all the measurable nanoparticles, i.e., all the particles except those having particle images cut off at edges of the images, among the nanoparticles contained in these images, and obtaining the arithmetic average thereof. In each of the examples and comparative examples including this example, the particle diameters were measured for 100 or more nanoparticles in total by using three or more TEM images. The average particle diameter is shown in Table 2.

Absorption/Emission Characteristics

Figure 2:
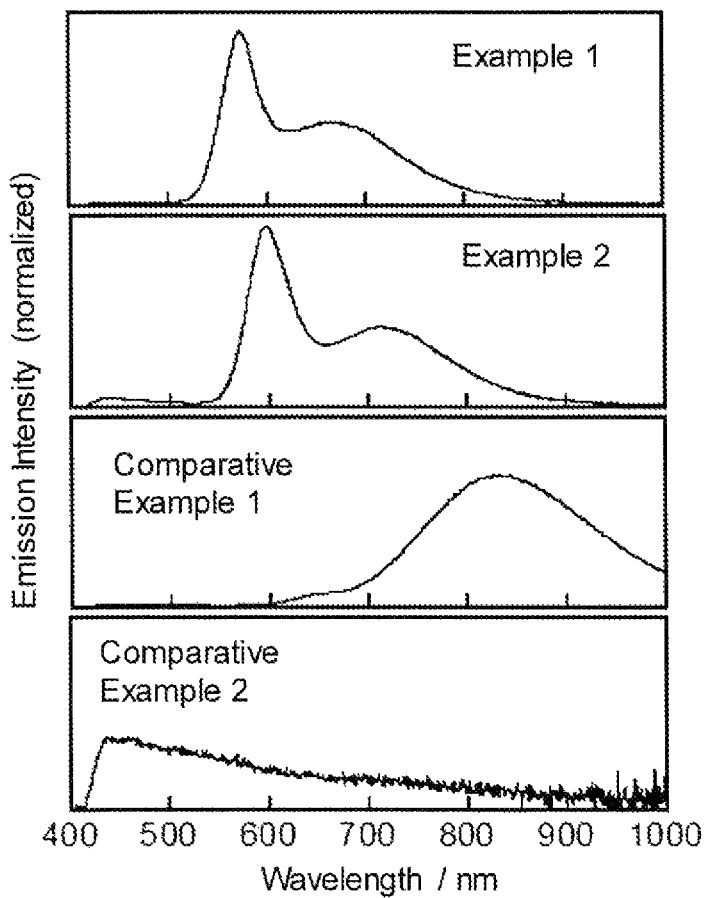
FIG. 2 shows examples of emission spectra of the semiconductor nanoparticles of Example 1, Example 2, Comparative Example 1 and Comparative Example 2.

Absorption and emission spectra of the semiconductor nanoparticles obtained in Examples 1, 2 and Comparative Examples 1, 2 were measured. The absorption spectra were measured by using a diode array spectrophotometer (manufactured by Agilent Technologies, trade name: Agilent 8453A) at a wavelength of 190 nm to 1100 nm. The emission spectra were measured by using a multichannel spectrometer (manufactured by Hamamatsu Photonics, trade name: PMA 11) at the excitation wavelength of 365 nm. The absorption spectra are shown in FIG. 1, and the emission spectra are shown in FIG. 2.

Table 2 shows an emission peak wavelength of a steep emission peak that is band edge emission, a half-value width of the band edge emission, an emission quantum yield of the band edge emission, and a Stokes shift of the band edge emission that is obtained by subtracting the emission peak energy value obtained from the emission spectrum, from the absorption peak energy value obtained from the absorption spectrum, observed in each emission spectrum.

TABLE 2

| | Band edge emission peak wavelength (nm) | Band edge emission quantum yield (%) | Band edge emission-half-value width (meV) | Stokes shift (meV) | Average particle diameter (nm) |
|---|---|---|---|---|---|
| Example 1 | 575 | 0.37 | 159 | 219 | 9.4 |
| Example 2 | 599 | 0.18 | 158 | 248 | 7.3 |
| Comparative Example 1 | defect emission only | | | | 7.5 |
| Comparative Example 2 | no emission | | | | 38 |

From Table 2, the semiconductor nanoparticles obtained by using lithium salt, silver salt, and indium salt in Examples 1, 2 exhibited the band edge emission with a half-value width of 250 meV or less. In contrast, Comparative Example 1 using silver salt instead of lithium salt as compared to Example 1 exhibited defect emission only, and Comparative Example 2 using lithium salt instead of silver salt as compared to Example 1 had no emission confirmed.

From Table 2 and FIGS. 1 and 2, it was confirmed that by changing the ratio of lithium salt to silver salt in Examples 1 and 2 for synthesizing the semiconductor nanoparticles, the peak wavelength of the absorption and emission spectra indicative of the band edge emission was shifted to a short wavelength as compared to Comparative Example 1. It was also confirmed that since the ratio of lithium salt to silver salt is high in Example 1 as compared to Example 2, the peak wavelength of the absorption and emission spectra indicative of the band edge emission was shifted to a shorter wavelength.

Example 3

Fabrication of Semiconductor Nanoparticles

In a mixed liquid of 0.1 cm$^3$ of 1-dodecanethiol and 2.9 cm$^3$ of oleylamine, 0.05 mmol of silver acetate (AgOAc), 0.05 mmol of lithium acetate (LiOAc), 0.06 mmol of acetylacetonate gallium (Ga(acac)$_3$), 0.04 mmol of indium acetate (In(OAc)$_3$), and 0.2 mmol of thiourea serving as the sulfur source were charged and dispersed. The dispersion was put into a test tube together with a stirrer, and nitrogen substitution was performed and followed by a heat treatment performed at 150° C. for 10 minutes as a first stage heat treatment and at 300° C. for 10 minutes as a second stage heat treatment in a nitrogen atmosphere while the contents in the test tube were stirred. After the heat treatment, an obtained suspension was allowed to cool and then centrifuged (radius: 146 mm, 4000 rpm, 5 minutes), the supernatant was filtered through a membrane filter having a pore diameter of 0.20 μm. Addition of 3 ml of methanol thereto was followed by centrifugation (radius: 146 mm, 4000 rpm, 5 minutes) to precipitate semiconductor nanoparticles, and the supernatant was discarded. Addition of 3 ml of methanol was performed again and followed by centrifugation to precipitate semiconductor nanoparticles, and further addition of 3 ml of ethanol was followed by centrifugation under the same conditions to precipitate semiconductor nanoparticles. The precipitate was taken out, dried, and then dispersed in chloroform to obtain a semiconductor nanoparticle dispersion.

Examples 4, 5, and Comparative Example 3

Semiconductor nanoparticle dispersions were obtained as in Example 3 except that the raw material preparation compositions were changed as shown in Table 3.

TABLE 3

| | AgOAc (mmol) | LiOAc (mmol) | Ga(acac)$_3$ (mmol) | In(acac)$_3$ (mmol) | (NH$_2$)$_2$CS (mmol) |
|---|---|---|---|---|---|
| Example 3 | 0.05 | 0.05 | 0.06 | 0.04 | 0.2 |
| Example 4 | 0.02 | 0.08 | 0.06 | 0.04 | 0.2 |
| Example 5 | 0.07 | 0.03 | 0.06 | 0.04 | 0.2 |
| Comparative Example 3 | 0.10 | — | 0.06 | 0.04 | 0.2 |

Figure 3:
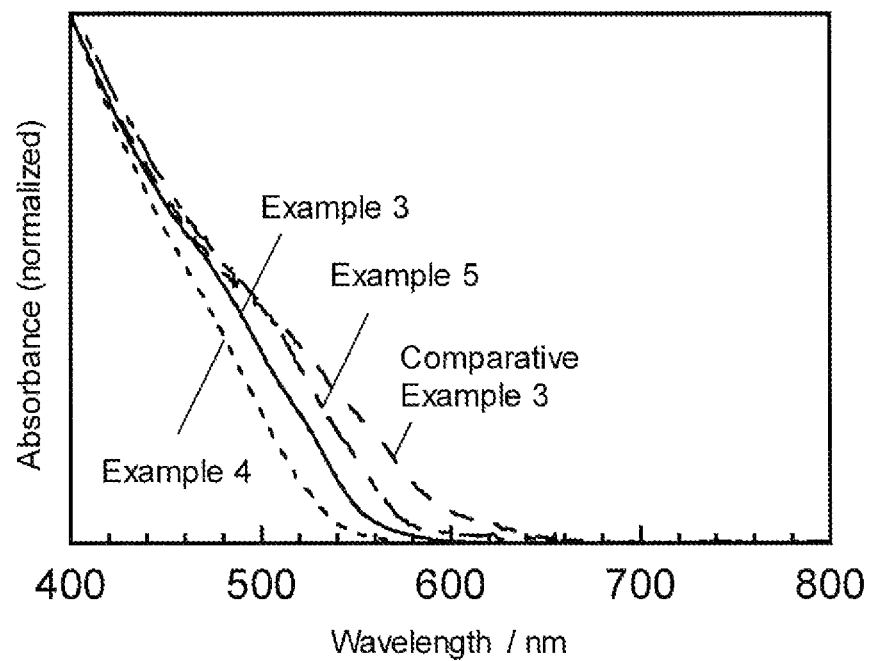
FIG. 3 shows examples of absorption spectra of the semiconductor nanoparticles of Examples 3-5 and Comparative Example 3.
Figure 4:
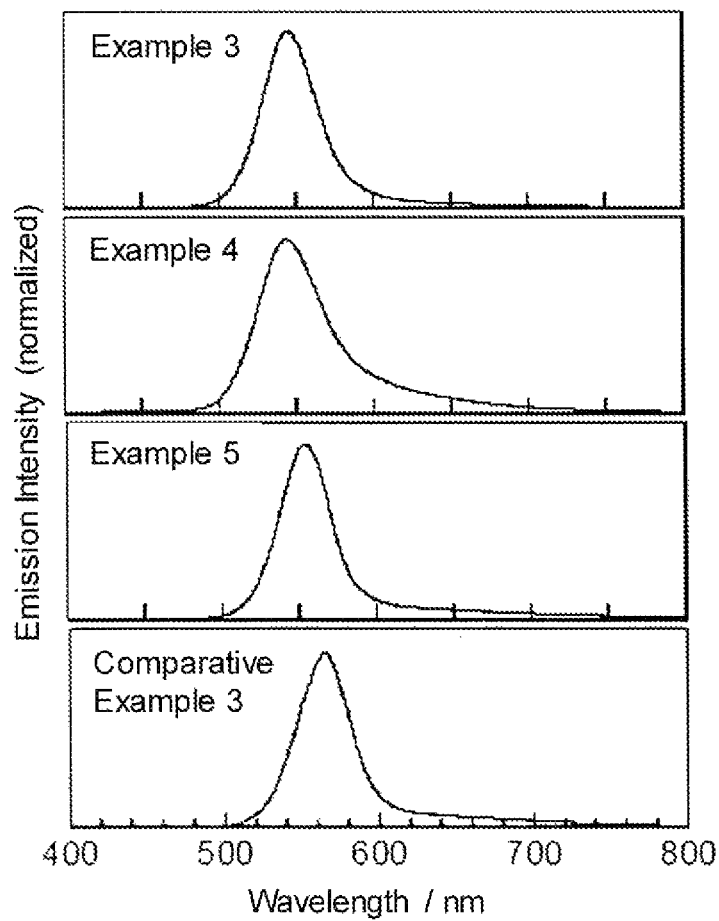
FIG. 4 shows examples of emission spectra of the semiconductor nanoparticles of Examples 3-5 and Comparative Example 3.

The semiconductor nanoparticles obtained in Examples 3 to 5 and Comparative Example 3 were measured in terms of the average particle diameter and the light emission characteristics as in Example 1. The results are shown in Table 4. The absorption spectra are shown in FIG. 3, and the emission spectra are shown in FIG. 4.

TABLE 4

|  | Band edge emission peak wavelength (nm) | Band edge emission quantum yield (%) | Band edge emission emission-half-value width (meV) | Stokes shift (meV) | Average particle diameter (nm) |
|---|---|---|---|---|---|
| Example 3 | 545 | 28.2 | 180 | 109 | 7.2 |
| Example 4 | 543 | 12.1 | 196 | 278 | 3.1 |
| Example 5 | 554 | 48.3 | 162 | 88 | 5.9 |
| Comparative Example 3 | 565 | 33.5 | 160 | 48 | 6.0 |

From Table 4, the semiconductor nanoparticles obtained by using lithium salt, indium salt, and gallium salt in Examples 3 to 5 exhibited the band edge emission with a half-value width of 250 meV or less.

From Table 4 and FIGS. 3 and 4, it was confirmed that by changing the ratio of lithium salt to silver salt in Examples 3 to 5 for synthesizing the semiconductor nanoparticles, the peak wavelength of the absorption and emission spectra indicative of the band edge emission was shifted to a short wavelength as compared to Comparative Example 3. It was also confirmed that in Example 4 having the highest ratio of lithium salt to silver salt, the peak wavelength of the absorption and emission spectra indicative of the band edge emission was shifted to a shorter wavelength as compared to Examples 3 and 5. Example 5 had the highest quantum yield of the band edge emission as compared to Examples 3 and 4.

Examples 6 to 8

Semiconductor nanoparticle dispersions were obtained as in Example 4 except that the raw material preparation compositions were changed as shown in Table 5.

TABLE 5

|  | AgOAc (mmol) | LiOAc (mmol) | Ga(acac)$_3$ (mmol) | In(acac)$_3$ (mmol) | (NH$_2$)$_2$CS (mmol) |
|---|---|---|---|---|---|
| Example 6 | 0.07 | 0.03 | 0.08 | 0.02 | 0.2 |
| Example 7 | 0.07 | 0.03 | 0.04 | 0.06 | 0.2 |
| Example 8 | 0.07 | 0.03 | 0.02 | 0.08 | 0.2 |

Figure 5:
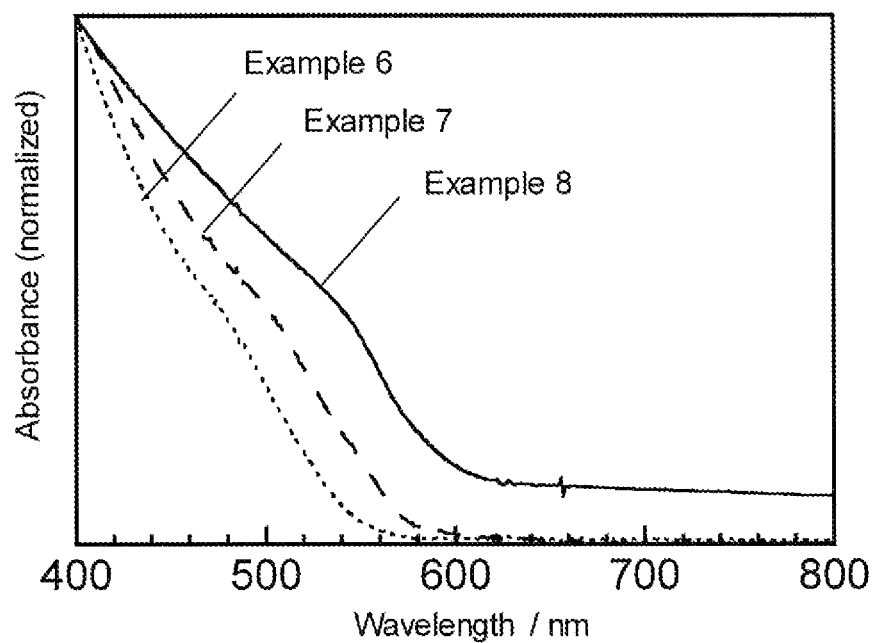
FIG. 5 shows examples of absorption spectra of semiconductor nanoparticles of Examples 6-8.
Figure 6:
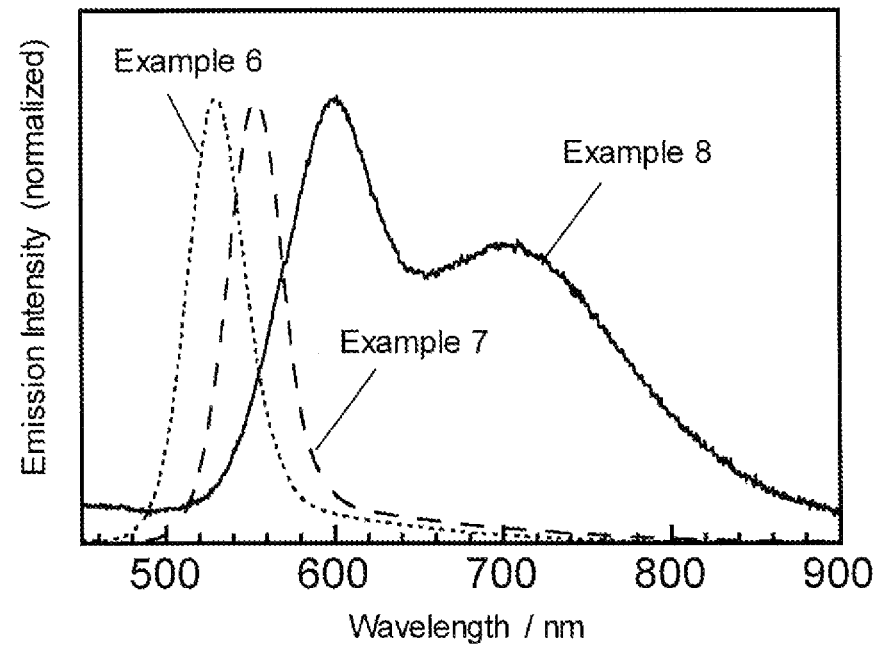
FIG. 6 shows examples of emission spectra of the semiconductor nanoparticles of Examples 6-8.

The semiconductor nanoparticles obtained in Examples 6 to 8 were measured in terms of the average particle diameter and the light emission characteristics as in Example 1. The results are shown in Table 6. The absorption spectra are shown in FIG. 5, and the emission spectra are shown in FIG. 6.

TABLE 6

|  | Band edge emission peak wavelength (nm) | Band edge emission quantum yield (%) | Band edge emission emission-half-value width (meV) | Stokes shift (meV) | Average particle diameter (nm) |
|---|---|---|---|---|---|
| Example 6 | 529 | 73.3 | 181 | 181 | 3.9 |
| Example 7 | 552 | 48.3 | 162 | 175 | 6.0 |
| Example 8 | 596 | 8.3 | 198 | 191 | 7.9 |

From Table 6, the semiconductor nanoparticles obtained by using lithium salt, indium salt, and gallium salt in Examples 6 to 8 exhibited the band edge emission with a half-value width of 250 meV or less as in Example 3.

From Table 6 and FIGS. 5 and 6, it was confirmed that by changing the ratio of gallium to indium in Examples 6 to 8 for synthesis, the peak wavelength of the absorption and emission spectra indicative of the band edge emission was shifted to a shorter wavelength as compared to Examples 7 and 8 and that the band edge emission quantum yield was increased.

Example 9

Fabrication of Core-Shell Type Semiconductor Nanoparticles

The concentration of the semiconductor nanoparticles obtained in Example 1 was adjusted by adding chloroform to the absorbance of 0.5 at the optical path length of 1 cm and the wavelength of 500 nm, and 2 ml thereof was weighed out. Subsequently, the solvent was dried under reduced pressure. After weighing out and adding $5.33 \times 10^{-5}$ mmol of acetylacetonate gallium (Ga(acac)$_3$) and $5.33 \times 10^{-5}$ mmol of thiourea, 3.0 mL of oleylamine was added before nitrogen substitution inside the test tube. Heating was performed with stirring at 300° C. for 15 minutes and followed by radiational cooling to room temperature. Centrifugation (4000 rpm, 5 minutes) was performed to remove a precipitate. A supernatant was filtered through a membrane filter having the pore diameter of 0.20 μm. Addition of methanol was followed by centrifugation (4000 rpm, 5 minutes), and ethanol was added to an obtained precipitate, which was then centrifuged (4000 rpm, 5 minutes) to obtain core-shell type semiconductor nanoparticles as a precipitate. The precipitate was dried, and the nanoparticles were dispersed by adding chloroform.

Example 10

Core-shell type semiconductor nanoparticles were obtained as in Example 9 except that the semiconductor nanoparticles obtained in Example 3 were used.

Example 11

Fabrication of Core-Shell Type Semiconductor Nanoparticles

The concentration of the semiconductor nanoparticles obtained in Example 3 was adjusted by adding chloroform to the absorbance of 0.5 at the optical path length of 1 cm and the wavelength of 500 nm, and 2 ml thereof was weighed out. Subsequently, the solvent was dried under reduced pressure. After weighing out and adding $5.33\times10^{-5}$ mmol of acetylacetonate gallium (Ga(acac)$_3$), $5.33\times10^{-5}$ mmol of lithium acetate (LiOAc), and $10.7\times10^{-5}$ mmol of thiourea, 3.0 mL of oleylamine was added before nitrogen substitution inside the test tube. Heating was performed with stirring at 300° C. for 15 minutes and followed by radiational cooling to room temperature. Centrifugation (4000 rpm, 5 minutes) was performed to remove a precipitate. A supernatant was filtered through a membrane filter having the pore diameter of 0.20 µm. Addition of methanol was followed by centrifugation (4000 rpm, 5 minutes), and ethanol was added to an obtained precipitate, which was then centrifuged (4000 rpm, 5 minutes) to obtain core-shell type semiconductor nanoparticles as a precipitate. The precipitate was dried, and the nanoparticles were dispersed by adding chloroform.

Figure 7:
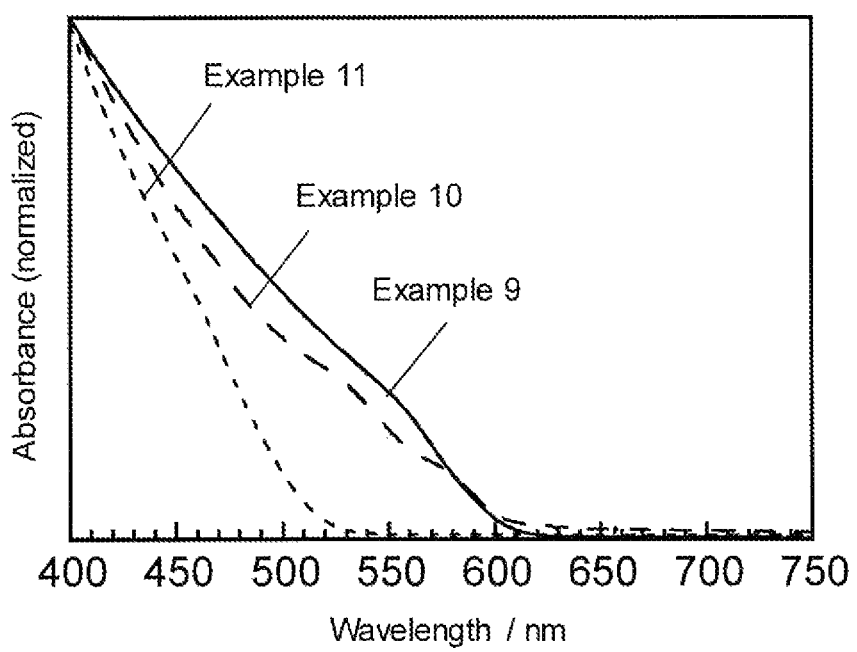
FIG. 7 shows examples of absorption spectra of core-shell type semiconductor nanoparticles of Examples 9-11.
Figure 8:
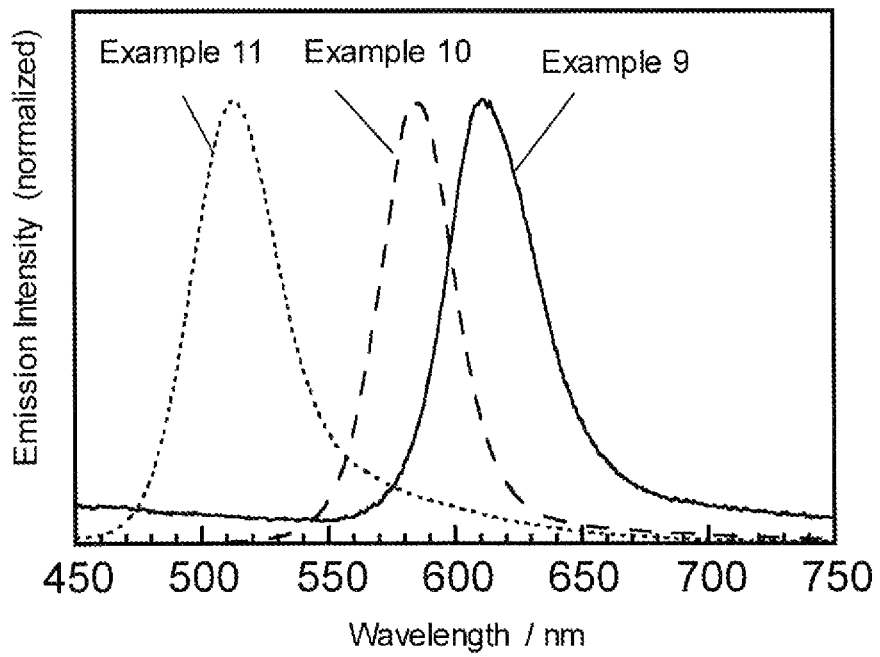
FIG. 8 shows examples of emission spectra of the core-shell type semiconductor nanoparticles of Examples 9-11.

The core-shell type semiconductor nanoparticles obtained in Examples 9 to 11 were measured in terms of the average particle diameter and the light emission characteristics as in Example 1. The results are shown in Table 7. The absorption spectra are shown in FIG. 7, and the emission spectra are shown in FIG. 8.

TABLE 7

| | Band edge emission peak wavelength (nm) | Band edge emission quantum yield (%) | Band edge emission emission-half-value width (meV) | Stokes shift (meV) | Average particle diameter (nm) |
|---|---|---|---|---|---|
| Example 9 | 610 | 1.4 | 138 | 189 | 10.4 |
| Example 10 | 584 | 65.8 | 127 | 199 | 7.4 |
| Example 11 | 513 | 7.3 | 193 | 273 | 6.3 |

From Table 7, it was confirmed that the band edge emission quantum yield was improved by forming the semiconductor nanoparticles of the core-shell type in Examples 9 and 10. It was also confirmed that by synthesizing the semiconductor nanoparticles and the core-shell type semiconductor nanoparticles by using lithium compound in Example 11, the peak wavelength of the emission spectrum indicative of the band edge emission was shifted to a shorter wavelength as compared to Comparative Example 3 and Example 3.

It is to be understood that although the present invention has been described with regard to preferred embodiments thereof, various other embodiments and variants may occur to those skilled in the art, which are within the scope and spirit of the invention, and such other embodiments and variants are intended to be covered by the following claims.

Although the present disclosure has been described with reference to several exemplary embodiments, it is to be understood that the words that have been used are words of description and illustration, rather than words of limitation. Changes may be made within the purview of the appended claims, as presently stated and as amended, without departing from the scope and spirit of the disclosure in its aspects. Although the disclosure has been described with reference to particular examples, means, and embodiments, the disclosure may be not intended to be limited to the particulars disclosed; rather the disclosure extends to all functionally equivalent structures, methods, and uses such as are within the scope of the appended claims.

One or more examples or embodiments of the disclosure may be referred to herein, individually and/or collectively, by the term "disclosure" merely for convenience and without intending to voluntarily limit the scope of this application to any particular disclosure or inventive concept. Moreover, although specific examples and embodiments have been illustrated and described herein, it should be appreciated that any subsequent arrangement designed to achieve the same or similar purpose may be substituted for the specific examples or embodiments shown. This disclosure may be intended to cover any and all subsequent adaptations or variations of various examples and embodiments. Combinations of the above examples and embodiments, and other examples and embodiments not specifically described herein, will be apparent to those of skill in the art upon reviewing the description.

In addition, in the foregoing Detailed Description, various features may be grouped together or described in a single embodiment for the purpose of streamlining the disclosure. This disclosure may be not to be interpreted as reflecting an intention that the claimed embodiments require more features than are expressly recited in each claim. Rather, as the following claims reflect, inventive subject matter may be directed to less than all of the features of any of the disclosed embodiments. Thus, the following claims are incorporated into the Detailed Description, with each claim standing on its own as defining separately claimed subject matter.

The above disclosed subject matter shall be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure may be determined by the broadest permissible interpretation of the following claims and their equivalents, and shall not be restricted or limited by the foregoing detailed description.

All publications, patent applications, and technical standards mentioned in this specification are herein incorporated by reference to the same extent as if each individual publication, patent application, or technical standard was specifically and individually indicated to be incorporated by reference.

What is claimed is:

1. A method for manufacturing a semiconductor nanoparticle comprising:
    performing a heat treatment of a first mixture containing a silver (Ag) salt, a first lithium (Li) salt, a salt containing at least one of indium (In) and gallium (Ga), a sulfur source, and an organic solvent,
    wherein a ratio of a number of atoms of Li to a total number of atoms of Ag and Li in the first mixture is greater than 0 and less than 1, and
    wherein the semiconductor nanoparticle has a composition in which a content of sulfur is 35 mol % to 55 mol %.

2. The method according to claim 1, wherein the semiconductor nanoparticle has the composition in which a total content of silver (Ag) and lithium (Li) is 10 mol % to 30 mol %, and a total content of indium (In) and gallium (Ga) is 15 mol % to 35 mol %.

3. The method for manufacturing a semiconductor nanoparticle according to claim 1, wherein the first mixture is heat-treated at a temperature in a range of 30° C. or more and less than 200° C. for 1 to 120 minutes and then further heat-treated at a temperature in a range of 200° C. or more and 350° C. or less.

4. A method for manufacturing a core-shell type semiconductor nanoparticle comprising: performing a heat treatment of a second mixture containing the semiconductor nanoparticle obtained by the method for manufacturing according to claim 1, a second lithium salt, a compound containing a group 13 element, a simple substance of a group 16 element or a compound containing a group 16 element, and an organic solvent.

* * * * *